(12) United States Patent  (10) Patent No.: US 7,394,273 B2
Hsu et al.  (45) Date of Patent: Jul. 1, 2008

(54) ON-CHIP ELECTROMIGRATION MONITORING SYSTEM

(75) Inventors: Louis L. Hsu, Fishkill, NY (US); Hayden C. Cranford, Jr., Cary, NC (US); Oleg Gluschenkov, Poughkeepsie, NY (US); James S. Mason, Eastleigh (GB); Michael A. Sorna, Hopewell Junction, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 11/306,985

(22) Filed: Jan. 18, 2006

(65) Prior Publication Data

US 2007/0164768 A1  Jul. 19, 2007

(51) Int. Cl.
  *G01R 31/02* (2006.01)
(52) U.S. Cl. .......................... 324/763; 324/765; 438/14; 714/758
(58) Field of Classification Search ................. 324/763, 324/765, 158.1; 714/733–734; 438/14–17; 257/48
  See application file for complete search history.

(56) References Cited

U.S. PATENT DOCUMENTS

| 5,264,377 | A | 11/1993 | Chesire et al. |
| 5,514,974 | A | 5/1996 | Bouldin |
| 6,097,203 | A * | 8/2000 | Parker et al. ................. 324/763 |
| 6,147,361 | A | 11/2000 | Lin et al. |
| 6,614,251 | B2 * | 9/2003 | Ootsuji ........................ 324/765 |
| 6,933,730 | B2 * | 8/2005 | Parker et al. ................. 324/538 |
| 7,211,995 | B2 * | 5/2007 | Ventomaki ............... 324/158.1 |
| 2005/0077907 | A1 * | 4/2005 | Parker et al ................. 324/538 |
| 2006/0267621 | A1 * | 11/2006 | Harris et al. ................. 324/765 |

* cited by examiner

*Primary Examiner*—Ha Nguyen
*Assistant Examiner*—Arleen M Vazquez
(74) *Attorney, Agent, or Firm*—Daryl K. Neff; H. Daniel Schnurmann

(57) ABSTRACT

A packaged semiconductor chip is provided which includes a semiconductor chip and a package element. The semiconductor chip includes a plurality of semiconductor devices and a plurality of conductive features disposed at an exterior face of the semiconductor chip. The package element has a plurality of external features conductively connected to the plurality of conductive features of the semiconductor chip. The semiconductor chip includes a monitored element including a conductive interconnect that conductively interconnects a first node of the semiconductor chip to a second node of the semiconductor chip. A detection circuit in the semiconductor chip is operable to compare a variable voltage drop across the monitored element with a reference voltage drop across a reference element on the chip at a plurality of different times during a lifetime of the packaged semiconductor chip so as to detect when the resistance of the monitored element is over threshold.

7 Claims, 8 Drawing Sheets

ON-CHIP ELECTROMIGRATION MONITORING SYSTEM

BACKGROUND OF THE INVENTION

The present invention relates to microelectronic structures and methods of making them and more particularly to a system provided on a chip for monitoring an increase in a resistance of a conductive interconnect of a chip due to electromigration.

Electromigration has long been identified as a major failure mechanism of metal interconnects of semiconductor chips. Electromigration is indeed one of the worst reliability concerns affecting integrated circuits throughout the last 50 years. Electromigration tends to produce voids within metal conductors) due to movement of metal ions in directions parallel to high density current flow within the chip. Failure due to electromigration is caused by a positive divergence of the ionic flux leading to an accumulation of vacancies and forming a void in the metal. To the casual observer, it appears that ions are moved "downstream" by the force of "electron wind".

For the reasons stated above, electromigration (hereinafter, "EM") and failures that it engenders can be categorized as a wear-out mechanism. In general, the failure rate of a conductive interconnect is proportional to current density and the average temperature of the local region of the chip surrounding the conductive interconnect. EM becomes worse as the width and/or thickness of metal wiring on the chip are scaled. Current density within some conductive interconnects having small cross-sectional area can exceed $10^5$ A/cm$^2$.

Methods are known by which high current and/or high voltage and temperature stress are used to provide accelerated testing to screen out unreliable (defective) chips in relatively short periods of time. Several methods are described in prior art references as described herein. For example, U.S. Pat. No. 6,147,361 to Lin et al. ("the '361 Patent") describes an EM sensor which includes a polysilicon body which is conductively connected to a monitored metal piece 400 and two electrodes 14b. In use, a linear metal "dummy" feature overlying a top surface of the EM sensor is stressed by a high voltage. When EM occurs within the dummy feature, local joule heating therein causes carrier mobility within the EM sensor to increase drastically. The test methodology in the '361 Patent is similar to that described in U.S. Pat. No. 5,264,377 to Chesire et al. in monitoring using a dummy metal feature under accelerated stress conditions. The approaches described therein poorly reflect the actual EM failure mechanism because neither the dummy feature nor the methodology used to test for electromigration are representative of actual conditions which lead to EM failures of conductive interconnects on the chip. The dummy feature fails to adequately represent real-life conductive interconnects which have topology including corners and via contact regions. Accelerated test methodology, while predictive of future failures which might occur during later use of the chip, fails to detect failures at time points during the actual useful lifetime of the chip.

U.S. Pat. No. 5,514,974 to Bouldin describes a somewhat different approach in which a dummy metal feature is also subjected to accelerated lifetime testing at wafer-level test time to determine whether a resistance of the dummy feature increases to a level which exceeds a threshold. Here, the dummy feature includes a series of metal segments which are connected together using a series of vias. When a difference between the resistance of the dummy feature and a control structure exceeds the threshold, the chip is determined to fail and is rejected during the wafer-level test.

All of the above-described approaches test for EM failure at wafer-level test time and during a specific test mode. Moreover, the dummy features tested in accordance with such approaches are bulky and are usually provided within a kerf area adjacent to a chip, or inside a specially designed test chip of the wafer. Moreover, purposes of these EM tests are usually directed to the qualification of processes and/or the screening out of unreliable (defective) chips during burn-in tests. The above-described prior art approaches do not provide for monitoring the effects of EM throughout the useful lifetime of the chip. After the chips have been diced from the wafer and packaged, the EM monitoring can no longer be performed within the chip. However, it is abundantly evident that EM degradation does not stop after the chip is installed in a system and shipped to customers.

SUMMARY OF THE INVENTION

Accordingly, in view of the problems mentioned above in relation to the prior art, it would be desirable to provide an on-chip EM sensor which monitors a degradation of a semiconductor chip due to EM during the useful lifetime of the chip, i.e., when the chip is packaged and installed in a system for normal use. When the resistance of a wiring element within the semiconductor chip increases beyond a warning threshold level, either the chip is replaced or a voltage stress level of the chip is reduced in a way that delays the expected failure time of the chip. In such way, customers are permitted to trade increased system performance in exchange for increased lifetime of the chip. In addition, in accordance with the embodiments of the present invention described herein, operators of systems which include a defective chip having over threshold resistance are permitted to replace the defective chip before the defective chip jeopardizes the whole system, thereby preventing the system from crashing unpredictably.

Therefore, according to one aspect of the invention, a packaged semiconductor chip is provided which includes a semiconductor chip and a package element. The semiconductor chip includes a plurality of semiconductor devices and a plurality of conductive features disposed at an exterior face of the semiconductor chip. The package element has a plurality of external features conductively connected to the plurality of conductive features of the semiconductor chip. The semiconductor chip further includes a monitored element including a conductive interconnect that conductively interconnects a first node of the semiconductor chip to a second node of the semiconductor chip. A detection circuit included in the semiconductor chip is operable to compare a variable voltage drop across the monitored element with a reference voltage drop across a reference element on the chip at a plurality of different times during a lifetime of the packaged semiconductor chip so as to detect when the resistance of the monitored element is over threshold.

In accordance with another aspect of the invention, an apparatus is provided in a semiconductor chip which is operable to detect an increase in resistance of a monitored element including a conductive interconnect. Such apparatus includes a resistive voltage divider circuit in the semiconductor chip which is operable to output a plurality of reference voltages ranging from a first voltage to a second voltage. A plurality of comparators are provided in the semiconductor chip, each of which has a first input and a second input. The first input is coupled to receive one of the plurality of reference voltages output by the resistive voltage divider circuit and the second input is coupled to receive a monitored voltage representative of a resistance of the monitored element. Each of the plurality of comparators produces an output that indicates whether the monitored voltage exceeds the one of the plurality of reference voltages so as to precisely determine a value of the resistance of the monitored element.

DETAILED DESCRIPTION

Figure 1:
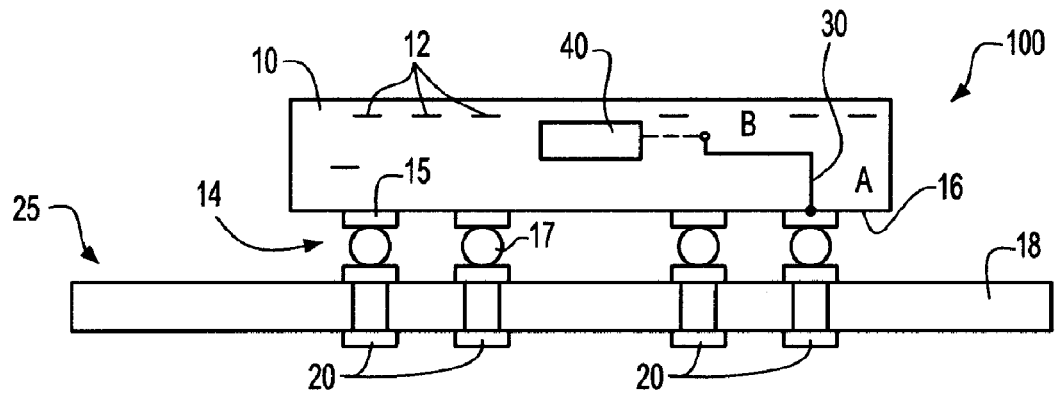
FIG. 1 is an elevational view illustrating a packaged chip including an electromigration (EM) resistance monitoring/detection circuit in accordance with an embodiment of the invention.

Referring to FIG. 1, a first embodiment of the invention will now be described. FIG. 1 illustrates a packaged chip 100 such as may be installed and operated in a larger scale electronic system, e.g., a computing and/or communications system, among others. Thus, the apparatus and test method described herein are usable at a time after wafer-level test time. Preferably, they are usable at a time when the packaged chip is installed in such electronic system for normal operation. As such, the packaged chip includes more than a bare semiconductor chip and includes that which is needed to conductively connect the conductive contacts of the semiconductor chip to the package element. An exemplary packaged chip 100 will now be described which includes a semiconductor chip and a package element connected thereto. The particular arrangement by which the semiconductor chip is connected to the package element is provided only by way of example. Many different arrangements can be used to connect the semiconductor chip to the package element.

As shown in FIG. 1, the packaged chip includes a semiconductor chip 10 having a plurality of semiconductor devices 12 thereon and a plurality of conductive features 14, e.g., bond pads 15, conductive bumps 17, etc., disposed at an exterior face 16 of the semiconductor chip 10. The packaged chip further includes a package element 25 which has a dielectric element 18 and a plurality of external conductive features 20 conductively connected to the conductive features 14 of the semiconductor chip. In the exemplary arrangement shown in FIG. 1, the chip is conductively connected to the package element via a "flip-chip" bonding in which the bond pads 15 of the chip 10 face the package element 25. As illustrated in FIG. 1, a particular bonding technique known as "C4" ("controlled collapse chip connection") utilizes the melting of conductive bumps 17, e.g., solder bumps, to connect the bond pads of the chip 10 to the conductive features of the package element 25.

As further shown in FIG. 1, the packaged chip includes a monitored element 30 including a conductive interconnect within the which conductively connects a first node (A) of the semiconductor chip to a second node (B) of the semiconductor chip. Preferably, at least one of the first and second nodes is located at the face of the semiconductor chip. The packaged chip further includes a detection circuit 40. The detection circuit is preferably provided as a feature of the same semiconductor chip on which the monitored element is provided. However, when multiple semiconductor chips are connected together within a single package, the detection circuit may be disposed on a different semiconductor chip than a chip on which the monitored element is provided. The function of the detection circuit is to compare a variable voltage drop across the monitored element with a reference voltage drop across a reference element. The detection circuit is capable of performing these comparisons at a plurality of different times during a lifetime of the packaged semiconductor chip so as to detect when the resistance of the monitored element exceeds a threshold value.

Figure 2:
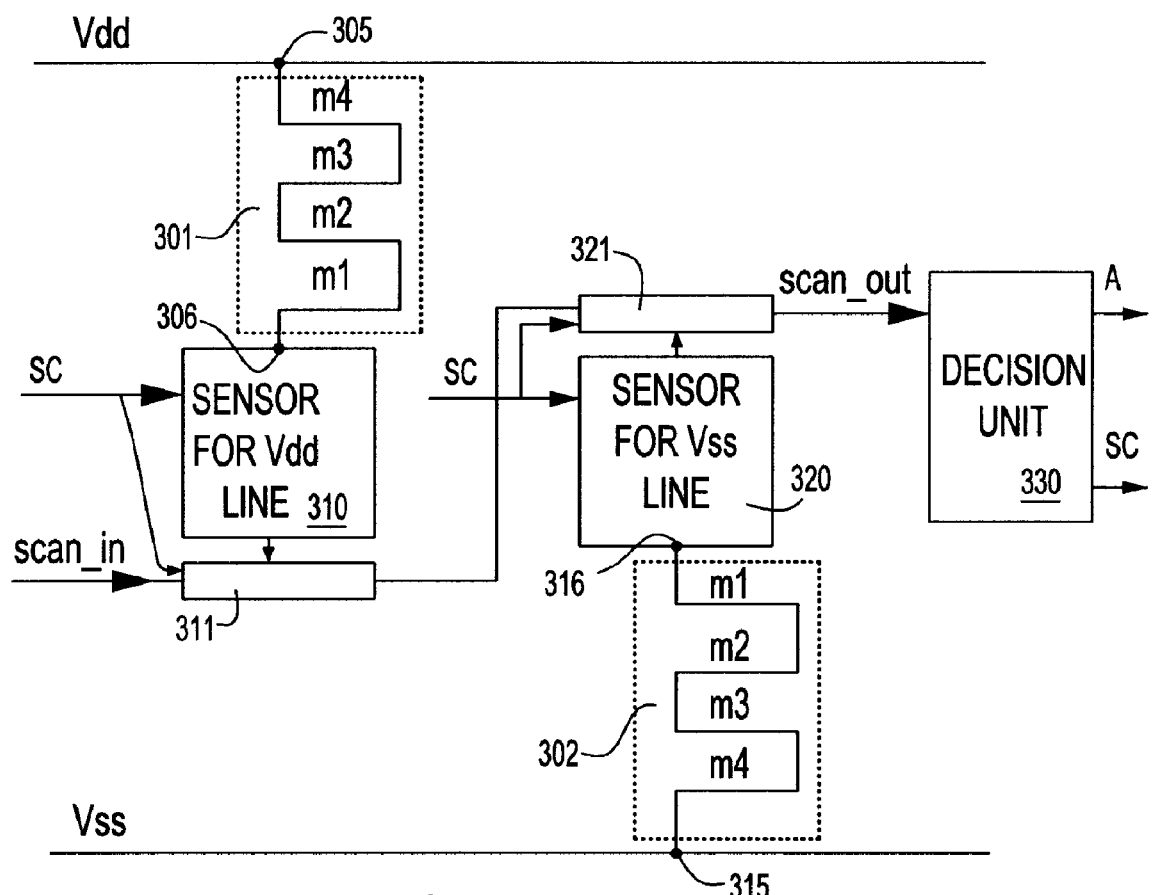
FIG. 2 is a block and schematic diagram further illustrating interconnections to the (EM) resistance monitoring circuit of FIG. 1 within a semiconductor chip and associated processing circuitry for use therewith.

FIG. 2 is a block and schematic diagram illustrating in greater detail specific features relating to the above-described detection circuit and its interconnection to the monitored elements. As depicted in FIG. 2, a first monitored element 301 has a structure including a conductive interconnect of the chip which includes a plurality of wires at a plurality of wiring levels of the chip, e.g., at wiring levels m1, m2, m3, and m4 of the chip. As such, the conductive interconnect may be one within circuitry actually used within the semiconductor chip during normal operation. Alternatively, the conductive interconnect can be a replica interconnect, having features similar to an actual conductive interconnect but which does not function as a conductive interconnect within circuitry of the semiconductor chip used during normal operation. The first conductive interconnect is coupled between a first conductive node 305 of the semiconductor chip and a second node 306 of the chip at another location of the semiconductor chip. In the exemplary embodiment illustrated in FIG. 2, the first node 305 of the semiconductor chip is provided at a contact or conductive pad at the exterior of the chip which is used to connect the chip to a source of power supply voltage (Vdd), Preferably, the first conductive interconnect is representative of a series of longest wires or "worst case" conductive interconnect from the power supply Vdd that are normally provided on the chip. However, the first conductive interconnect need not have a first node connected to the power supply. Instead, the first node can be a connection point to a source of a signal or a reference on the chip, for example, among others.

A second monitored element 302 has a similar structure, i.e., one which includes a conductive interconnect of the chip having a plurality of wires at a plurality of different wiring levels, e.g., at wiring levels m1, m2, m3, and m4 of the chip. The second conductive interconnect is coupled between another (third) conductive node 315 of the semiconductor chip at a ground (Vss) contact of the chip and a fourth node 316 of the chip within the semiconductor chip.

In the embodiment particularly shown in FIG. 2, the apparatus 300 includes a first detection circuit 310 or "sensor" which is operable to detect when a resistance of the first monitored element 301 having a connection to Vdd (power supply) becomes excessive, i.e., when the resistance exceeds a threshold. In addition, a second detection circuit 320 or "sensor" is operable to detect when the resistance of the second conductive interconnect 302 having a connection to Vss (ground) becomes excessive, i.e., when it exceeds a threshold. As will be described more fully below, each of the sensors 310 and 320 operates by comparing a voltage drop across the monitored element with a reference voltage drop across a reference element of the chip. Since the detection circuits are preferably provided on the same semiconductor chip or within the same package as the monitored conductive interconnects, the detection circuits are operable to perform such comparisons at a plurality of different times during a "lifetime" of the chip, i.e., during different times while the packaged semiconductor chip is installed in an electronic system for normal use. In one embodiment, the detection circuits merely produce "yes" or "no" type outputs indicating whether the resistance of the monitored conductive interconnect does, in fact, exceed a predetermined threshold when tested, or does not. In other embodiments, as will be described more fully below with reference to FIGS. 5-8, the outputs of the detection circuits represent measurements of the resistance of the conductive interconnects.

As further shown in FIG. 2, apparatus 300 further includes latches 311 and 321 coupled to receive and temporarily store data representing the outputs of the detection circuits 310, 320, respectively. The latches preferably are scannable elements, referred to as "scan latches", the scan latches being connected together in series and readable by shifting the stored data through the series of scan latches in an operational mode of the chip known as "scan mode." In the scan mode, the data stored in each of the scan latches are read out by supplying a scan clock ("SC") to each of the detection circuits 310, 320 and scan latches and shifting the stored data through all of the scan latches in the chain until all of the stored data are received through the "scan-out" line at the decision unit 330. The decision unit, in turn, takes action based on the data received from the scan_out line that represents the outputs of the detection circuits 310, 320. The decision unit monitors the data received from the plurality of detection circuits and outputs one or more signals (A) relating to actions in response to the outputs of the detection circuits. In addition, as further illustrated in FIG. 2, the decision unit 330 preferably generates and controls the supply of the scan clock signal (SC) to the scan latches 311, 321 of the electromigration monitoring apparatus. In this way, control over the operation of the monitoring apparatus and the output therefrom is through one central decision unit 330 within the monitoring apparatus 330.

In a preferred embodiment, the detection circuits are utilized only at particular times during the lifetime of the chip to determine whether the resistance of any of the monitored elements is over threshold, or alternatively, to determine what the value of such resistance is. Thus, the detection circuits are not utilized all of the time in the way that other circuits of the chip generally are. Rather, the detection circuits are preferably operated in short intervals long enough to determine the condition of the respective monitored elements to which they are connected. Outside of those short intervals, the detection circuits are turned off to conserve power. Changes in the resistance of the monitored elements occur over very long periods of use of the chip. As described above in the background, the temperatures and voltages applied to the chip during its use increase the resistance of the chip but only over those very long periods of time. Therefore, the detection circuits need only to operate occasionally during the lifetime of the chip In order to monitor these slowly occurring changes in resistance. For this purpose, the scan clock is active as a sample clock only at discrete times or during discrete intervals while the chip is in use. In this way, the scan clock operates the detection circuits during those intervals to sample the value of the resistance of the monitored elements. The detection circuits operate when this scan clock is active and do not operate when the scan clock is inactive. In turn, each scan latch stores the most recently sampled output of the detection circuit, for example, timed in accordance with a rising edge or a falling edge of the scan clock waveform.

The times at which the detection circuits check the monitored elements and at which the outputs of the detection circuits are scanned out to the decision circuit preferably occur periodically. For example, the scan clock may be supplied to the detection circuits for sampling the conditions of the monitored elements at a particular periodic rate, e.g., once every one minute, once every 10 minutes, or once every 60 minutes during the lifetime of the chip. In this way, the condition of the monitored elements are sampled periodically during the lifetime of the chip.

When a change occurs in the resistance of one of the monitored elements which causes the resistance of that monitored element to increase above the threshold, the periodic samples obtained by the monitoring apparatus 300 allow the decision circuit 330 to recognize the change when it occurs. After detecting the over threshold condition on the monitored element, the decision circuit 330 is able to take action. In a preferred embodiment, the monitored element includes an actual conductive interconnect of a normally operational circuit of the chip. In such case, when the detection circuit detects that the resistance of one of the monitored elements is over the threshold therefor, the decision circuit can then provide a signal to other circuitry for acting upon the over threshold condition.

Figure 3:
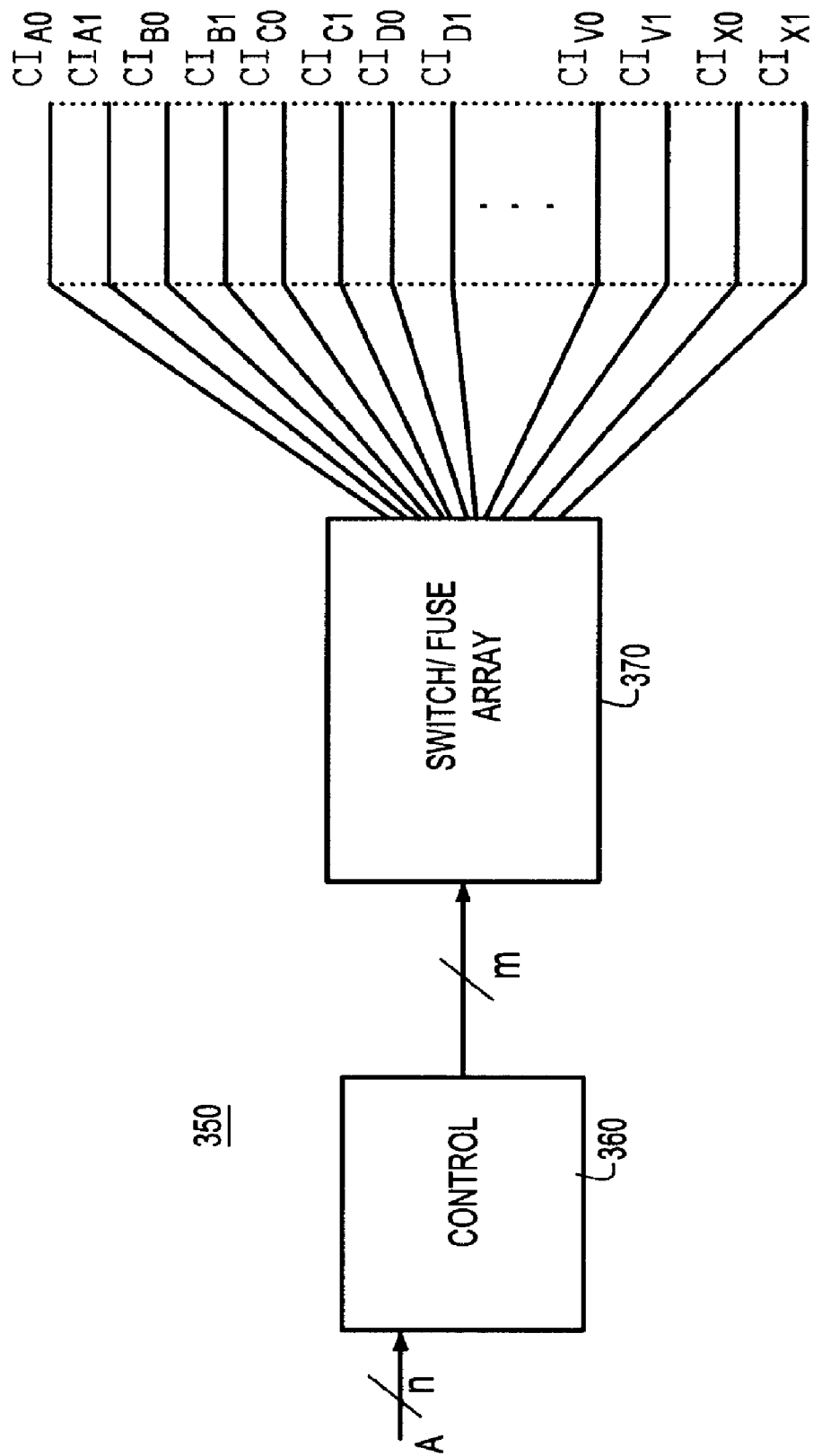
FIG. 3 is a block diagram illustrating a structure and function of a redundancy replacement apparatus for use with the EM monitoring circuit illustrated in FIGS. 1 and 2.

In a particular embodiment, a redundancy replacement apparatus 350 within the semiconductor chip as illustrated in FIG. 3 is used to take action when the decision circuit indicates that the resistance of at least one of the monitored elements is over threshold. In this case, the over threshold monitored element is considered to be defective. The redundancy replacement apparatus repairs the chip by disconnecting the defective monitored element from its normal connections and reconnecting a suitable redundancy element in its place. The redundancy replacement apparatus 350 includes control circuitry 360 and a switch array and/or fuse array 370. The purpose of the control circuitry 360 is to take the signals (A) represented as the n bits output from the decision circuit 330 (FIG. 2) and convert those signals to a set of m bits of switching signals. The set of switching signals are then usable by the switch/fuse array 370 to disconnect the defective monitored element and reconnect a different conductive interconnect in its place. For example, the signals output from the decision circuit may merely serve to identify one or more defective conductive interconnects of the chip in an encoded manner, for example, as a "1" bit occurring at a particular position within a string of "0" bits which otherwise indicate presence of non-defective conductive interconnects. The monitored elements of the chip are mapped to such string of "1"s and "0"s by the control circuitry 360 to identify which of the monitored elements are defective. The control circuitry 360 then provides decoded output having m bits (m>n) to the switch/fuse array for operating switches and/or fuses therein.

The switch and/or fuse array 370, in turn, performs the above-described disconnections and connections of conductive interconnects. The switch/fuse array can be implemented, for example, with memory cells of a nonvolatile memory such as flash memory. Alternatively, the switch/fuse array can be implemented by any nonvolatile memory such as memory which is kept permanently turned on, as by a battery backup, or memory loaded from a protected (e.g., system) area of magnetic memory each time the memory is turned on. Data stored in the memory cells of the nonvolatile memory are then provided to latches and other circuitry, e.g., banks of transistors. The other circuitry then connect certain ones of the conductive interconnects which are non-defective and also disconnects others of the conductive interconnects which are defective. Alternatively, a set of fuses can be provided which can be blown when a particular monitored conductive interconnect is determined to be defective. In like manner to that described above, the output of the fuses (blown and not blown) are provided to latches and other circuitry for connecting certain ones of the conductive interconnects which are not defective and disconnecting different (nondefective) conductive interconnects which are defective. For example, when a particular monitored conductive interconnect $CI_{40}$ is defective, by having resistance that exceeds a predetermined threshold, that conductive interconnect $CI_{40}$ is disconnected from the operating configuration of the chip and a suitable redundancy interconnect, e.g., $CI_{41}$ is connected in place of the defective interconnect.

Figure 4:
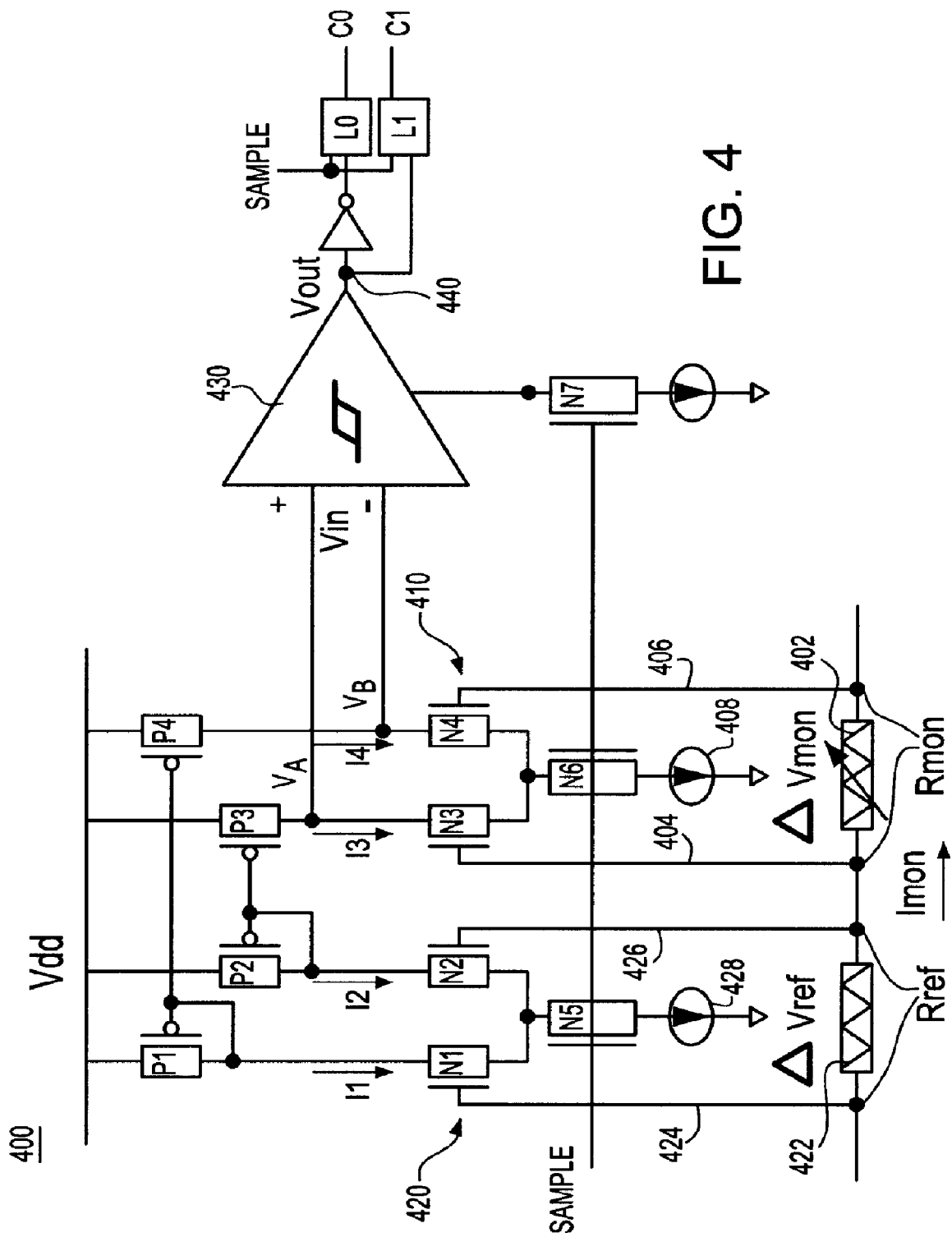
FIG. 4 is a block and schematic diagram illustrating a particular form of an EM monitoring circuit in accordance with a particular embodiment of the invention.

FIG. 4 is a schematic diagram illustrating a detection circuit 400 according to one embodiment of the invention. The purpose of the detection circuit is to monitor the resistance of a monitored element which includes a conductive interconnect and to produce an over threshold output signal when the resistance of a monitored element Rmon 402 exceeds a predetermined threshold level. A monitored element (Rmon) includes a plurality of interconnected wiring elements which includes one or more metals such as copper and/or aluminum which are susceptible to degradation due to electromigration. The resistance of the monitored element 402 is preferably designed to have a resistance in a range between 500 and 3000 ohms. The threshold level to which the resistance of Rmon is compared is set by use of a reference resistive element Rref 412 which preferably includes a material such as doped silicon, doped polysilicon, silicide, tungsten or other somewhat resistive metal or compound of metal which has finite resistance and is generally not susceptible to degradation due to electromigration. Preferably, the reference element has a resistance which is about 15% higher than the resistance of the monitored element as it exists when the monitored element is first placed in use on the chip. The resistance of the monitored element is intended to remain below the threshold level for an expected lifetime of the chip of 200,000 powered on hours (200 kPOH).

The detection circuit 400 is constructed to reduce the effect of noise, e.g., fluctuations in operating voltages and currents due to changes in temperature and operating conditions through use of circuitry that compares the resistance of the monitored conductive interconnect 402 to the resistance of the reference element 412. As illustrated in FIG. 4, the detection circuit includes a pair of differential amplifiers 410 and 420 connected back-to-back through current mirroring transistors P1, P2, P3 and P4, and a hysteresis comparator 430. Greatly simplified, a first differential amplifier 410 includes differential input transistors N3 and N4 which are coupled respectively to the higher and lower voltage nodes to which the monitored conductive interconnect is coupled. A constant current source 408 is biased to drive the differential amplifier when it is turned on. A third transistor N6 of the first differential amplifier 410 provides on-off control or tail current for turning the first differential amplifier on or off in accordance with a SAMPLE input provided to a gate thereof. Likewise, a second differential amplifier 420 includes differential input transistors N1 and N2 which are coupled respectively to the higher and lower voltage nodes to which the monitored reference element is coupled. A constant tail current source 428 is biased to drive the differential amplifier when it is turned on. A third transistor N5 of the second differential amplifier 420 provides on-off control or tail current for turning the first differential amplifier on or off in accordance with the SAMPLE input provided to a gate thereof. From inspection of FIG. 4, it can be seen that because of the current mirror devices P2 and P3, the current I3 that passes through transistor N3 on a first leg of the first differential amplifier is mirrored from the current I2 that passes through transistor N2 on a second leg of the second differential amplifier. Likewise, because of the current mirror devices P1 and P4, the current I4 through transistor N4 on a second leg of the first differential amplifier is mirrored from the current I1 that passes through transistor N1 on a first leg of the second differential amplifier. When the dimensions and doping profiles of transistors P2 and P3 are the same, the currents I2 and I3 are the same. In like manner, when the dimensions and doping profiles of transistors P1 and P4 are the same, the currents I1 and I4 are the same.

The monitored element Rmon and the reference element Rref are connected in series. A current (Imon) is passed through the Rmon and Rref elements to produce a monitored voltage drop (delta Vmon) and a reference voltage drop (delta Vref) across the monitored element and the reference element, respectively. These voltage drops are input to the differential amplifiers 410, 420 through monitoring wires 404, 406, 424 and 426, connected to monitoring points on (preferably at the ends) of each of the monitored elements. The monitoring wires 404, 406 apply the monitored voltage drop as a differential voltage at the input to the first differential amplifier 410 through the gates N3 and N4. Similarly, the monitoring wires 424, 426 apply the monitored voltage drop as a differential voltage at the input to the second differential amplifier 420 through the gates N1 and N2.

Outputs of the first differential amplifier 410 are voltages $V_A$ and $V_B$, taken from each leg thereof and applied as an input voltage Vin to the hysteresis comparator 430. The hysteresis comparator is used to filter out temporary fluctuations in the value of the input voltage Vin due to noise that might disturb a true determination of the result. Thus, the output of the hysteresis comparator changes from a low to a high value only when the input voltage Vin rises to a value greater than a predetermined high hysteresis value. The output then stays at the high value until a change occurs in the value of the input voltage Vin falling to a value lower than a predetermined low hysteresis value. A constant current source 428 is biased to drive the differential amplifier when it is turned on. Like the differential amplifiers, the hysteresis comparator operates only when the biasing input is provided to an on-off control transistor N7.

Through use of the differential amplifiers and the hysteresis comparator 430, the detection circuit provides an output (Vout) at node 440 indicating whether the resistance of the monitored element Rmon is greater than the resistance of the reference element Rref by more than the hysteresis value set within the comparator. This output is then latched in latches L1 and L0 as the complementary signals C1 and C0, the complementary output signal C0 being produced by applying the output signal to an inverter.

Figure 5:
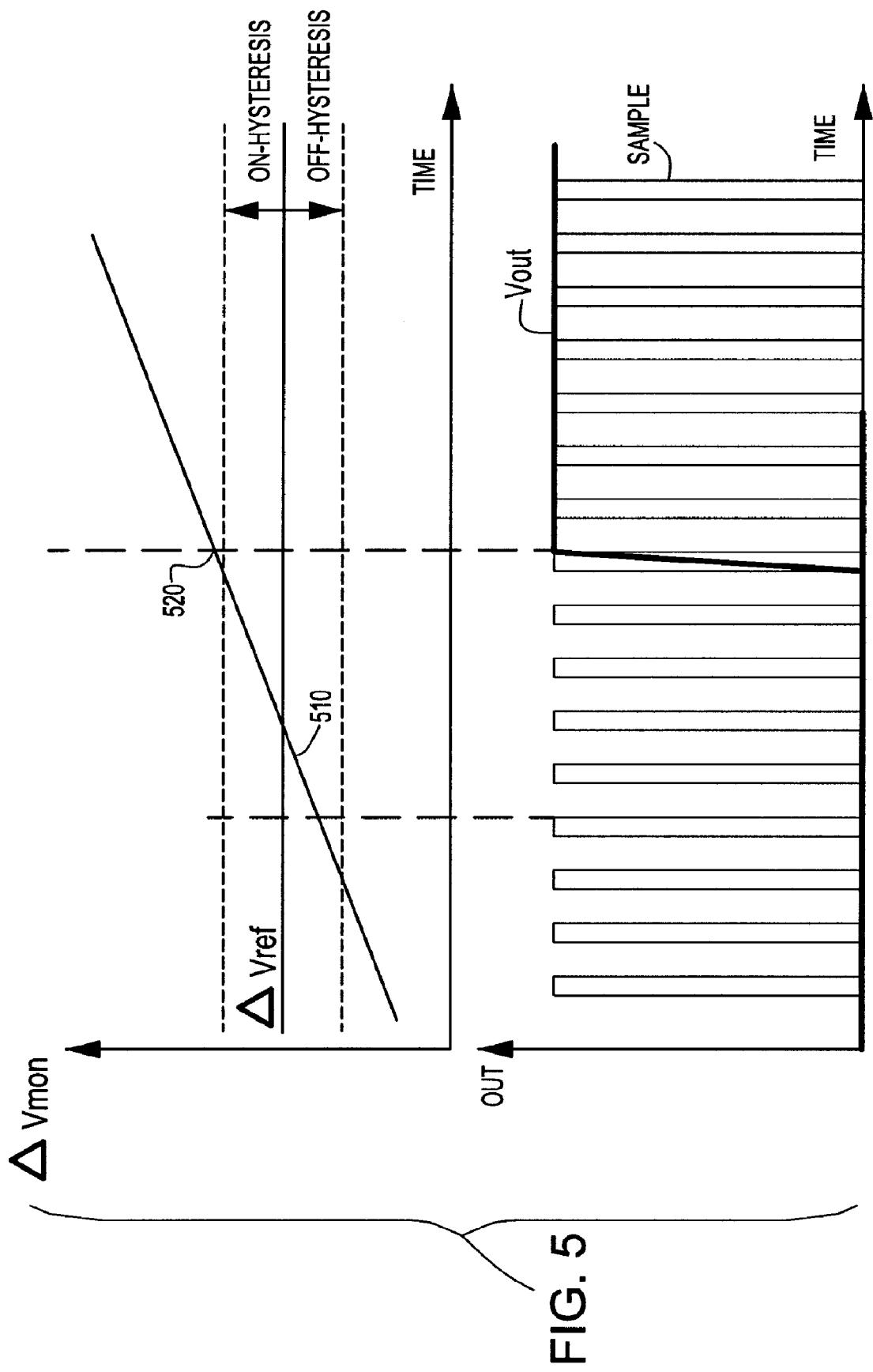
FIG. 5 is a timing diagram illustrates an operation of the EM monitoring circuit illustrated in FIG. 4 in accordance with a particular embodiment of the invention.

With additional reference to FIG. 5, the detection circuit operates as follows. Early during the chip's lifetime, for example, at a time 510, Rmon is less than Rref, which is reflected in Vmon being less than Vref. The SAMPLE signal is illustrated as a series of pulses which represent the active intervals of the SAMPLE signal. Of course, the time scale of FIG. 5 is greatly compressed to reflect changes which occur over the lifetime of the chip. Therefore, the amount of time between active intervals can be quite long. In addition, while the timing of the active intervals is preferably periodic, alternatively, the active intervals can be timed in accordance with other events, such as a power on operation, or diagnostic operations.

The detection circuit is activated during an active interval of the SAMPLE signal in which the SAMPLE signal to the gates of transistors N5, N6 and N7 is high. While the SAMPLE signal remains high, the differential amplifiers and the hysteresis comparator are activated. When such sampling is done early during the chip's lifetime, I1 is greater than I2 and, therefore, I4 is greater than I3. In such case, Vin is lower than the value required to cause the output of the hysteresis comparator to change. Therefore, the output Vout stays at the low level, indicating that the resistance of the monitored element is still below threshold. When the SAMPLE signal falls low again, the output is then latched by latches L0 and L1 to store the data value of the output signal Vout to be read out from a scan chain of such latches, as described above with reference to FIG. 2.

Sampling in such manner is done at intervals during the chip's lifetime, such intervals preferably occurring periodically. When such sampling is done later during the chip's lifetime, for example, at a time 520, the resistance of Rmon can increase due to electromigration to a level which exceeds that of Rref. In such case, delta Vmon then becomes higher than delta Vref. At this time, the current I3 becomes greater than the current I4, causing the voltage $V_A$ to rise to a level greater than $V_B$. When VA becomes greater than VB by more than the preset "on" hysteresis value shown in FIG. 5, the hysteresis comparator is triggered to change the value of Vout, which now becomes high. The data value of such output value is again stored in latches L0, L1 to be read by further operations as described above.

Figure 6:
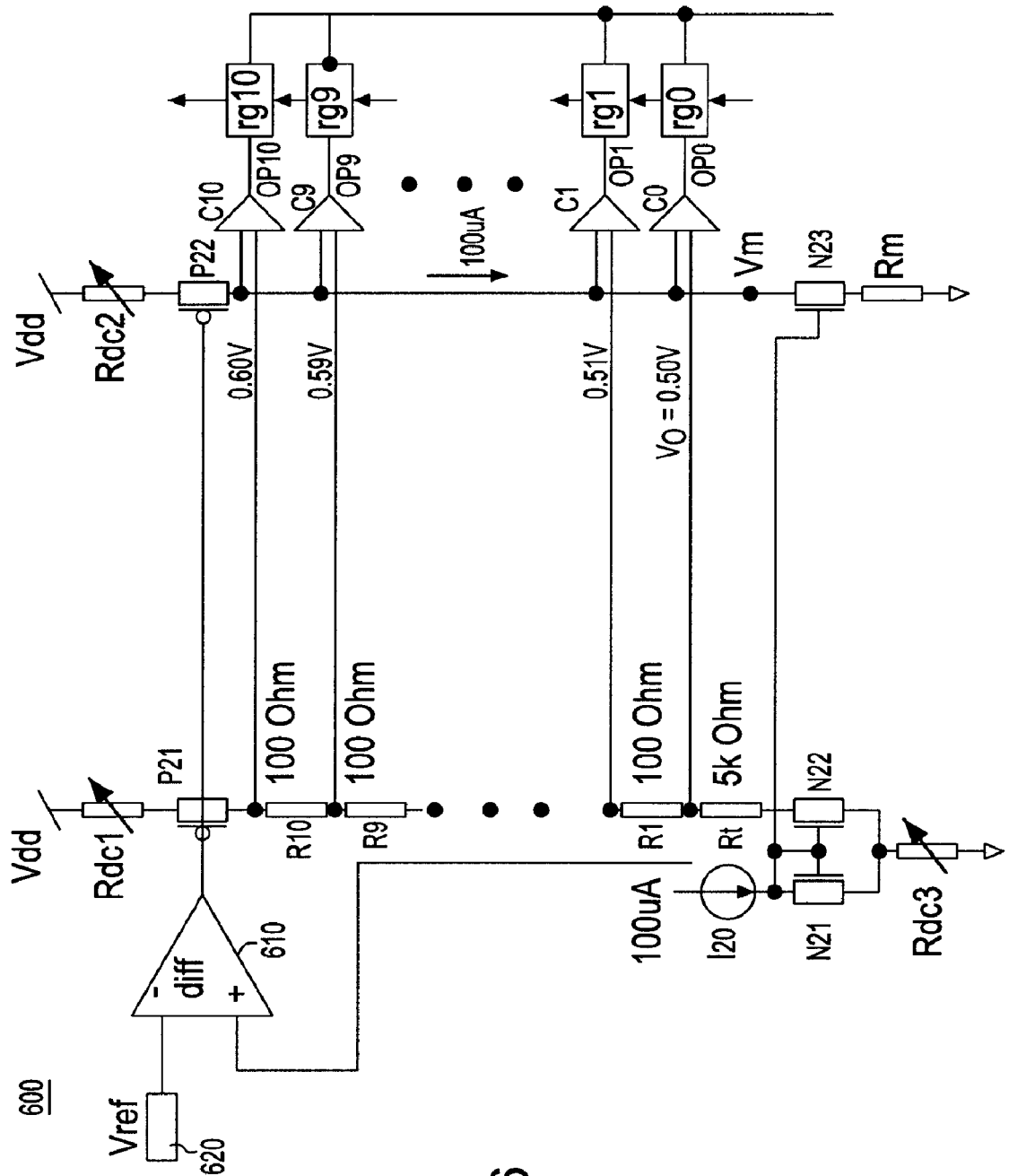
FIG. 6 is a block and schematic diagram illustrating a structure and function of an EM resistance measurement apparatus for a ground line interconnect, in accordance with an embodiment of the invention.

Another embodiment of the invention is illustrated schematically in FIG. 6. In this embodiment, a sensor apparatus 600 is operable to measure a resistance level of a monitored element Rm which includes a conductive interconnect within the chip. In this case, the monitored conductive interconnect Rmon is one which connects to a ground terminal of the chip, and as such, represents a ground line for the chip. The sensor apparatus 600 includes a resistive divider formed by a set of resistors, for example, a base level resistor Rt and 10 additional resistors R1, . . . , R9, and R10. These resistors are connected in series and are operable to output reference voltages at eleven different levels. The reference voltages which vary in value from each other by small increments, e.g., 0.01 V, and range from a first voltage, e.g., 0.50 V to a second voltage such as 0.60 V. The reference voltages are coupled to first input terminals of a plurality of corresponding comparators, e.g., eleven comparators C0, C1, . . . , C9 and C10 as indicated in FIG. 6. A variable input voltage is applied to second input terminals of each of the eleven comparators, the variable input voltage varying in accordance with a voltage drop across the monitored element Rm. Thus, a voltage varying according to the voltage drop across the monitored element Rm is applied as input to each of the eleven comparators C0 through C10 of the sensor apparatus 600 and is compared by the eleven comparators to each of eleven incrementally and uniformly varying reference voltage levels 0.50 V, 0.51 V, . . . 0.60 V output from the resistive voltage divider. In turn, the comparators produce outputs OP0, OP1, . . . OP10, each of which indicates whether the monitored voltage Vm exceeds the particular reference voltage level that is input to the particular comparator. For example, the comparator C0 produces an output OP0 indicating whether Vm exceeds the particular reference voltage level 0.50 V that is input thereto. On the other hand, the comparator C1 produces an output OP1 indicating whether Vm exceeds the particular reference voltage level 0.51 V that is input thereto. In this way, the outputs of all of the comparators precisely indicate to the nearest 100 ohms the current value of the resistance of the monitored element, e.g., whether the monitored element has a resistance of 5.2 kohm, 5.3kohm or 5.4 kohm, for example. The data values of the outputs of the eleven comparators are then stored in a scan chain of latches rg0, rg1, . . . , rg9 and rg10. The data stored in the latches are then available to be read out form the latches by a scan algorithm using a scan clock (CLK) to scan out the stored data in the direction shown by arrows such as discussed above with reference to FIG. 2 to communicate the stored resistance measurement to another part of the chip, such as to a higher-level monitoring circuit (not shown) which watches the resistance measurements of a plurality of such circuits.

The sensor shown in FIG. 6 operates with a high degree of immunity to noise, e.g., immunity to fluctuations in operating voltages and currents such as may be due to varying operating conditions such as temperature and power load. This is achieved through several things, as follows. Using a differential, e.g., operational amplifier 610, a base voltage V0 output from the resistive divider is regulated to the level of a highly stable reference voltage Vref such as provided from a bandgap reference 620. The single output of the operational amplifier is also coupled to the gates of PFETs P21 and P22 to regulate current in the paths through the resistive voltage divider and through the monitored element Rm, respectively. Current mirroring between the current flowing through the resistive voltage divider and the current flowing through the monitored element Rm is used to assure that any disturbance which may cause the current flowing through the resistive voltage divider to vary will cause the current flowing through the monitored element Rm to vary in the same way. In such way, the disturbance does not cause the monitored voltage Vm to change in relation to the reference voltages output by the resistive voltage divider. Current mirroring is provided by inputting a current I20 from a constant current source at a level of 100 microamperes (μA), for example, to a transistor N21 connected to operate as a diode and mirroring that current to the mirror transistors N22 and N23. In addition, the wiring elements which connect the power supply voltage Vdd to the source terminals of PFET P21 and PFET P22 are preferably designed to contain the same lengths of wiring and be as similar as possible to each other. In this way, a resistance Rdc1 through such wiring between Vdd and P21 varies in degree over time in a way that is expected to match the degree to which the resistance Rdc2 between Vdd and P22 varies over time. Rdc3 represents the variable resistance of a conductive interconnect between the source terminals of the transistors N21 and N22 which are conductively tied together and ground. Because of the bandgap reference voltage level Vref provided to the operational amplifier 610 change in the resistance of Rdc3 over time does not increase the voltage Vo at the base level of the resistive voltage divider.

In use, the group of comparators takes a precise measurement of the resistance of the monitored element Rm by comparing the voltage drop Vm across the monitored element to each of the incrementally varying reference voltages from Vo at 0.50 V to the highest voltage at 0.60 V. The data values of the outputs of all of the comparators are then latched in the latches rg0 through rg10, the data values then being available to be scanned out under control of other circuitry at some other point in time for actions, e.g., indication of a warning level or decision to perform a repair in accordance with those scanned out data values.

Figure 7:
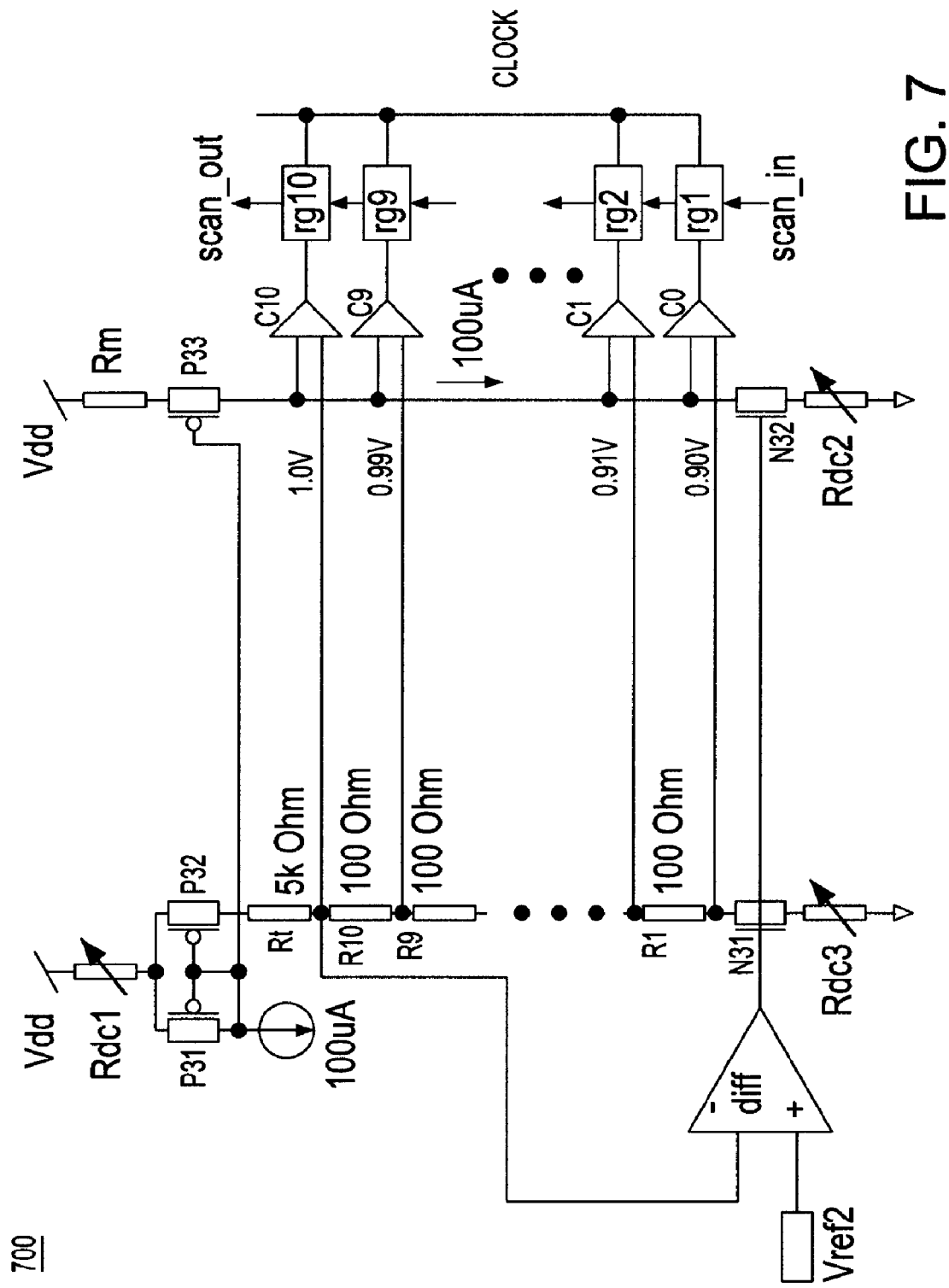
FIG. 7 is a block and schematic diagram illustrating a structure and function of an EM resistance measurement apparatus for a power line interconnect, in accordance with an embodiment of the invention.

FIG. 7 is a schematic diagram illustrating a similar measurement apparatus 700 for precisely measuring the resistance of a monitored element Rm which includes a conductive interconnect that is connected to a power supply terminal Vdd of the semiconductor chip. In this case, the devices included in and the functions performed by the apparatus 700 are essentially the same as those shown and described above with respect to FIG. 6, except as to their interconnection to the various elements, the use of PFETs PF31, P32 and P33 as the mirror devices in place of NFETs and the particular reference voltage levels used therein which vary in 0.01 V increments between a nominal level of 1.00 V and a lowered level 0.90 V. Here, a base reference voltage of 1.00 V is regulated at that level by operational amplifier 710, to which a bandgap reference Vref2 is input. In other respects, the operation of the measurement apparatus 700 is the same as that described above with reference to FIG. 6, such that apparatus 700 determines to the nearest 100 ohms the resistance of the monitored element between a base resistance value of about 5 kohm and a top of measurement range resistance value of about 6 kohm. Similar to the operation described above, a set of latches temporarily store the values output by each of the comparators C0 through C10, which are then available to be scanned out in the direction shown.

Preferably, both the apparatus which measures the resistance of the ground line interconnect (600; FIG. 6) and that which measures the power line interconnect (700; FIG. 7) are used simultaneously to determine the resistance values of the ground line interconnect and the power line interconnect and whether one of them exceeds a predetermined threshold value such that it fails. As the ground line and the power line can fail differently, monitoring both of them simultaneously will detect whichever of them fails first.

Figure 8:
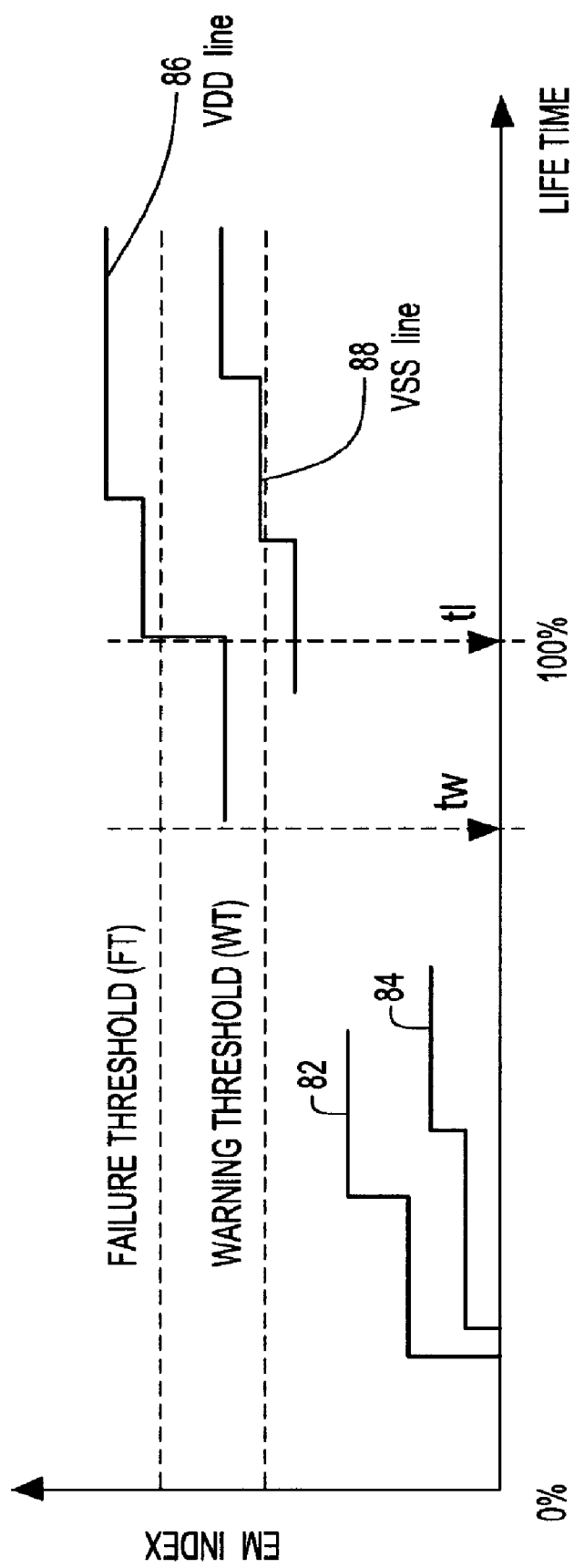
FIG. 8 is a timing diagram illustrating detection of a monitored resistance in relation to a warning threshold and to a failure threshold when utilizing the resistance measurement apparatuses illustrated in FIG. 6 and FIG. 7, in accordance with a particular embodiment of the invention.

FIG. 8 illustrates an example by which the resistance measurements of the ground line interconnect and the power line interconnect obtained by the sensor 600 (FIG. 6) and the sensor 700 (FIG. 7) are each compared to a warning threshold level (WT) and to a failure threshold level (FT) to determine whether action needs to be taken in response to these resistance measurements. Here, the resistance measurement 86 of the power line interconnect (Vdd line) is shown exceeding the WT and FT levels at times earlier than when the resistance measurement 88 of the ground line interconnect (VSS line) begins to exceed the WT.

As shown in FIG. 8, the resistance measurements indicated by the thermometer codes received from the scan latches for each of the ground line sensor 600 and the power line sensor 700 are plotted as the EM index. These resistance measurements 82, 84 begin to increase early during the lifetime of the chip. Later, when the EM index 86 for the power line interconnect reaches the predetermined WT level at time tw, control circuitry provides a warning signal to the larger scale electronic system in which the chip is incorporated. This allows precautionary measures to be implemented, such as a decision to operate at a somewhat lowered power level, e.g., with reduced supply voltage or a raised ground level, or even a decision to operate fewer circuits of the chip simultaneously, so as to reduce the temperature at which the chip operates. Another possible action may be to move critical operations away from a chip which has an interconnect line that exceeds the threshold, such that a possible failure later on will not compromise its operation at that time. Still later, at time t1 (end-of-life) when the resistance measurement of the power line interconnect 86 reaches the failure threshold (FT), the end of the lifetime of the chip is proclaimed. The chip must then be replaced to avoid a catastrophic system crash.

Figure 9:
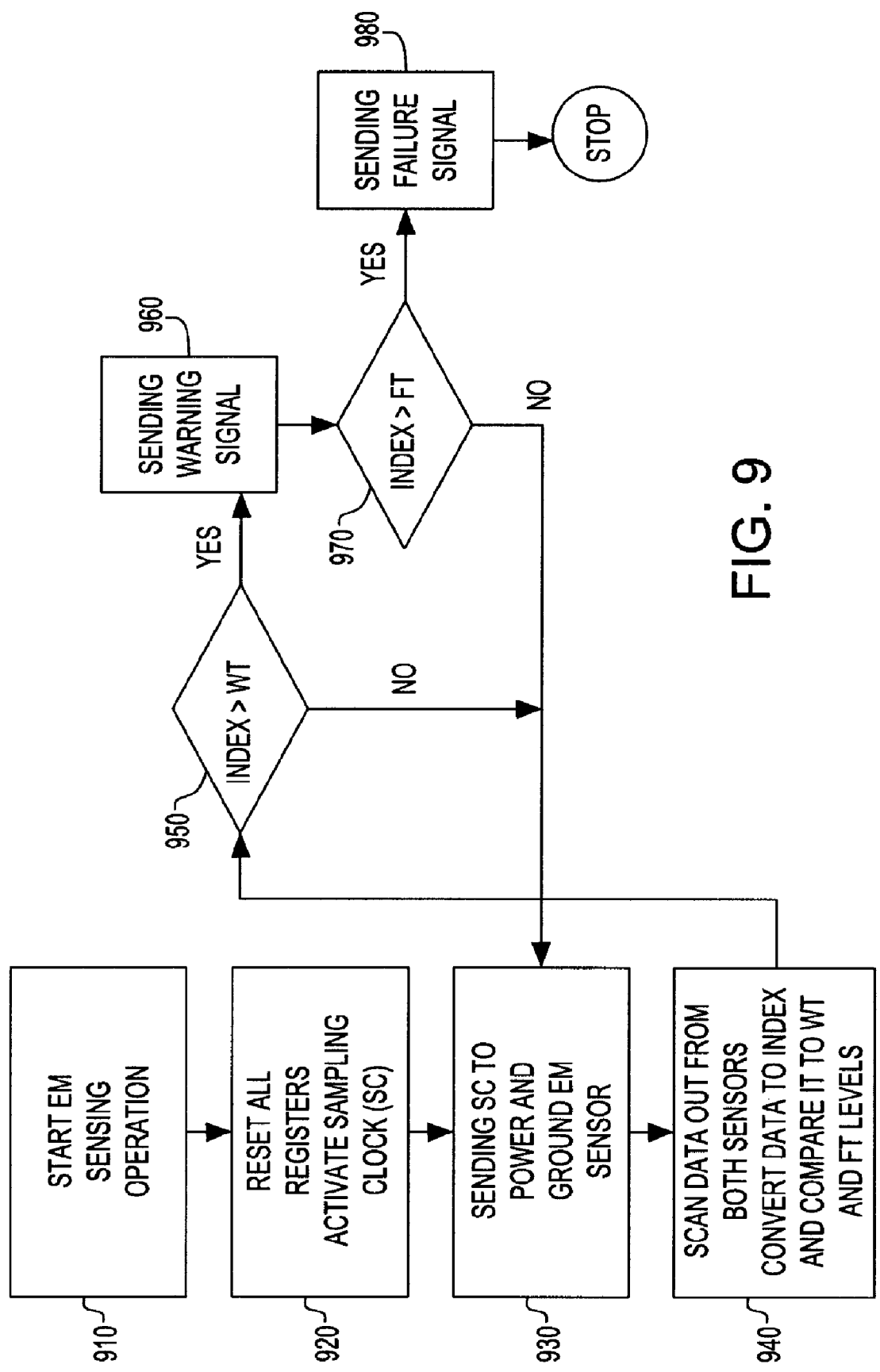
FIG. 9 is a flow diagram illustrating operation of a state machine for controlling operation of the EM resistance measurement apparatuses illustrated in FIG. 6 and FIG. 7, in accordance with an embodiment of the invention.

The operation of the ground line interconnect sensor, the power line interconnect sensor and the actions performed in response to the output thereof can be controlled in accordance with a state machine. Operation of the state machine is as shown in FIG. 9. Referring thereto, the monitoring of increases in resistance due to electromigration (EM sensing) preferably begins at block 910 from the first day that the chip is used in a larger system that incorporates the chip. At such time, at block 920, all registers of the chip are first reset to zero state, a sampling clock (SC) is started. When the system is powered down, the register information is stored in a non-volatile memory, so when the system is powered up again the information is restored into the registers to continue to monitor increases in resistance caused by electromigration. Referring to block 930, periodically, a sample clock (SC) is provided to the sensors 600, 700 (FIGS. 6 and 7) for monitoring the power line interconnect and the ground line interconnect. At block 940, after each sampling, the resulting thermometer codes (EM indices) are then scanned into a decision circuit from the set of scan latches at the sensors. The EM indices are then compared to WT and the FT. These comparisons can be performed either sequentially as shown in FIG. 9 or simultaneously. At the decision block 950, when the EM index is greater than a warning threshold level (WT) (decision: yes), a warning signal will be sent to the system (block 960). Otherwise, when the EM index is lower than WT (decision: no), normal monitoring operation is resumed from block 930 of FIG. 9. When the EM index is greater than failure threshold (FT) level (decision block 970) (decision: yes), then a failure signal (block 980) is sent to the electronic system. Otherwise, when the EM index is greater than WT but less than FT (decision: no at block 970), normal monitoring operation is resumed from block 930 of FIG. 9.

As described in the foregoing, apparatuses and methods are provided for monitoring lifetime degradation (increase in resistance) of power line and ground line interconnects, as caused mainly by electro-migration are demonstrated. One purpose achieved in accordance with at least some of the embodiments of the invention is to provide accurate information to the electronic system about the remaining lifetime of the chip in terms of EM. When the resistance of a monitored conductive interconnect within the chip reaches a warning threshold level, the system must either reduce some element of the chip performance, such as to reduce its power supply level, clock rate or the rate at which a signal is supplied thereto, or otherwise replace that chip with another chip that does not exceed the EM threshold. In such way, catastrophic failure of the system which might have occurred without the warning can be prevented now.

While the invention has been described in accordance with certain preferred embodiments thereof, many modifications and enhancements can be made thereto without departing from the true scope and spirit of the invention, which is limited only by the claims appended below.

What is claimed is:

1. A packaged semiconductor chip, comprising:
   a semiconductor chip including a plurality of semiconductor devices and a plurality of conductive features disposed at an exterior face of said semiconductor chip; and a package element having a plurality of external features conductively connected to said plurality of conductive features of said semiconductor chip, said semiconductor chip further including
- a monitored element including a conductive interconnect conductively interconnecting a first node of said semiconductor chip to a second node of said semiconductor chip,
- a detection circuit operable to compare a variable voltage drop across said monitored element with a reference voltage drop across a reference element on said chip at a plurality of different times during a lifetime of said packaged semiconductor chip to detect when a resistance of said monitored element is over threshold;
- a redundancy conductive interconnect, and a redundancy control circuit, said redundancy control circuit being operable in response to said resistance of said monitored element being detected over said threshold value to disconnect said monitored element and connect said redundancy conductive interconnect in place of said monitored element.

2. A packaged semiconductor chip, comprising:

a semiconductor chip including a plurality of semiconductor devices and a plurality of conductive features disposed at an exterior face of said semiconductor chip; and a package element having a plurality of external features conductively connected to said plurality of conductive features of said semiconductor chip, said semiconductor chip further including
- a monitored element including a conductive interconnect conductively interconnecting a first node of said semiconductor chip to a second node of said semiconductor chip, and
- a detection circuit operable to compare a variable voltage drop across said monitored element with a reference voltage drop across a reference element on said chip at a plurality of different times during a lifetime of said packaged semiconductor chip to detect when a resistance of said monitored element is over threshold wherein said monitored element includes a plurality of monitored elements connected between a plurality of pairs of nodes of said semiconductor chip, and said detection circuit includes a plurality of said detection circuits each being operable to detect when said resistance of a corresponding one of said plurality of monitored elements is over threshold, said packaged chip further comprising a decision unit operable to indicate an action condition based on outputs of said plurality of detection circuits.

3. The packaged chip as claimed in claim 2, wherein said action condition is a warning condition based on said outputs of said plurality of detection circuits indicating that at least one of said monitored elements has an over threshold resistance.

4. The packaged chip as claimed in claim 2, further comprising a scan chain including a plurality of scan latches each coupled to store an output of a corresponding one of said plurality of detection circuits, wherein said decision circuit is operable read said stored outputs from said plurality of scan latches to determine when any of said detection circuits detects that said resistance of the corresponding one of said monitored elements is over threshold.

5. A packaged semiconductor chip, comprising:

a semiconductor chip including a plurality of semiconductor devices and a plurality of conductive features disposed at an exterior face of said semiconductor chip; and a package element having a plurality of external features conductively connected to said plurality of conductive features of said semiconductor chip, said semiconductor chip further including
- a monitored element including a conductive interconnect conductively interconnecting a first node of said semiconductor chip to a second node of said semiconductor chip, and
- a detection circuit operable to compare a variable voltage drop across said monitored element with a reference voltage drop across a reference element on said chip at a plurality of different times during a lifetime of said packaged semiconductor chip to detect when a resistance of said monitored element is over threshold wherein said detection circuit includes a first differential amplifier having a first leg and a second leg and having input gates coupled across said reference element and includes a second differential amplifier having a first leg and a second leg and having input gates coupled across said monitored element, said first and second legs of said second differential amplifier being operable to conduct first and second currents mirrored from said first and second legs of said first differential amplifier, said detection circuit further comprising a comparator operable to receive input voltages from said first and second legs of said second differential amplifier and to determine when said resistance of said monitored element is over threshold.

6. The packaged chip as claimed in claim 5, wherein said comparator includes a hysteresis comparator, said hysteresis comparator operable to determine that said resistance of said monitored element is over threshold when said resistance of said monitored element exceeds said resistance of said reference element by more than a predetermined positive threshold value.

7. The packaged chip as claimed in claim 5, further comprising a sampling mechanism and at least one sample latch, said sampling mechanism operable to operate said first and second differential amplifiers and said comparator at limited intervals during said lifetime of said packaged chip, and said sample latch being operable to store an output of said comparator indicative of said result of detecting said resistance of said monitored element.

* * * * *